United States Patent [19]
Iwasaki

[11] Patent Number: 6,118,937
[45] Date of Patent: Sep. 12, 2000

[54] METHOD OF LAYING OUT A SEMICONDUCTOR INTEGRATED CIRCUIT

[75] Inventor: Tadashi Iwasaki, Tokyo, Japan

[73] Assignee: NEC Corporation, Tokyo, Japan

[21] Appl. No.: 08/788,641

[22] Filed: Jan. 27, 1997

[30] Foreign Application Priority Data

Jan. 25, 1996 [JP] Japan .................................. 8-010900

[51] Int. Cl.$^7$ ..................................................... G06F 17/50
[52] U.S. Cl. .................................. 395/500.11; 395/500.1; 395/500.14; 395/500.06
[58] Field of Search .................................. 364/488–491, 364/573; 395/500.02–500.19

[56] References Cited

U.S. PATENT DOCUMENTS

| | | | |
|---|---|---|---|
| 5,258,920 | 11/1993 | Haller et al. ......................... | 395/500.13 |
| 5,322,438 | 6/1994 | McNutt et al. ....................... | 395/500.09 |
| 5,706,206 | 1/1998 | Hammer et al. ..................... | 395/500.06 |
| 5,761,080 | 6/1998 | DeCamp et al. ..................... | 395/500.06 |

FOREIGN PATENT DOCUMENTS

| | | | |
|---|---|---|---|
| 2-310944 | 12/1990 | Japan .............................. | H01L 21/82 |
| 5-109896 | 4/1993 | Japan .............................. | H01L 21/82 |
| 5-120375 | 5/1993 | Japan .............................. | G06F 15/60 |
| 6-224302 | 8/1994 | Japan .............................. | H01L 21/82 |

OTHER PUBLICATIONS

Tompa ("An Optimal Solution to a Wire–Routing Problem", Journal of Computer and System Sciences, Oct. 1, 1981, vol. 23, No. 2, pp. 127–150.

Arora et al. ("Modeling and extraction of interconnect capacitances for multilayer VLSI circuits", IEEE, vol. 15, No. 1, pp. 58–67, Jan. 1, 1996.

Steptoe ("Convergent layout optimization for deep submicron designs", Electronic Engineering, vol. 67, pp. 67–70, May 1, 1995).

Caggiano et al. ("A PC program that generates a model of the parasitics for IC packages", IEEE, Proceedings of the 44th Electronic Components and Technology Conference, pp. 683–686, Jan. 1994).

Thakur et al. ("An optimal layer assignment algorithm for minimizing crosstalk for three layer VHV channel routing", IEEE, Proceedings of 1995 International Symposium on Circuits and Systems, vol. 1, pp. 207–210, Jan. 1995).

PTO 98–4220 (Translation of Japanese Kokai Patent No. 5–120375, translated by the Ralph McElroy Translation Company, Sep. 1998).

PTO 98–4259 (Translation of Japanese Patent Application No. 6–224,302, translated by FLS, Inc., Sep. 1998).

*Primary Examiner*—Kevin J. Teska
*Assistant Examiner*—Phallaka Kik
*Attorney, Agent, or Firm*—Young & Thompson

[57] ABSTRACT

A method of laying out a semiconductor integrated circuit, includes the steps of placing function cells, routing interconnections between the function cells, extracting a distance "di" between adjacent pairs of the interconnections on which signals are transmitted except for interconnections on which clock signals are transmitted, extracting a length "ai" of the interconnections which are arranged in parallel to each other at the corresponding distance "di", calculating $Cp=\Sigma_i(ai/di)$, and re-routing the interconnections to reduce the value Cp.

2 Claims, 5 Drawing Sheets

METHOD OF LAYING OUT A SEMICONDUCTOR INTEGRATED CIRCUIT

BACKGROUND OF THE INVENTION

The present invention relates to a method of layout of a semiconductor integrated circuit, and more particularly to a routing method thereof.

Generally, a gate array or cell-based system integrated circuit device has been designed as follows. Function cells which form basic logic cells have previously been prepared by automatic placement of the function cells and subsequent automatic routing of the interconnections between the function cells so as to design any desired logic circuits.

FIG. 1 is a flow chart illustrative of conventional automatic placement and subsequent automatic routing. Function cell placement 101 is carried out along with a floor plan having previously been prepared in consideration of density of interconnections between the function cells. Subsequently, routing 102 of interconnections between the function cells is carried out along with routing channels having previously been defined. Finally, verifying processes 103 and 104 are carried out to verify the correspondence of the currently designed logic circuit to the desired logic circuit. If the correspondence can be verified. then the layout processes are terminated. If, however, no correspondence can be verified, then the function cell placement 101 or the routing 102 is again carried out until the correspondence can be verified.

The above routing process 102 is carried out for power interconnections which are provided for supplying power and signal interconnections which are provided for transmitting signals between input and output terminals of the function cells. Particularly, the capacity of the signal interconnections are mainly dominated by a capacitance between substrates and a capacitance between different level interconnection layers, whilst a capacitance between adjacent two interconnections in the same level is so small as almost ignoble. For those reasons, it is general that the routing is carried out so that the length of the interconnection is as short as possible to minimize the interconnection delay in transmission of signals.

Recently, however, the micro-lithography techniques have progressed so that the width of the interconnections and the distance between the same may be defined in the one micron order, and thus the parasitic capacitance between the adjacent pairs of interconnections in the same level can no longer be ignored. Assuming that a 2-micron silicon oxide film as an interlayer insulator is formed on a silicon substrate and that interconnections having a thickness of 1 micron and a width of 1 micron are formed over the silicon substrate so as to have a distance of 1 micron between the adjacent two interconnections, a total capacitance of a single signal interconnection is 0.24 pF/mm whilst a parasitic capacitance of the adjacent two interconnections is 0.14 pF/mm which is 60% of the total capacitance.

In order to settle the above issue of the large parasitic capacitance of the adjacent two interconnections on which clock signals are transmitted, the following layout was proposed which is disclosed in the Japanese laid-open patent publication No. 4-207071. FIG. 2 is a plan view illustrative of an automatic routing of interconnections between function cells in the semiconductor integrated circuits. First level signal interconnections 1A, 1B, 1C, 1D, and 1E as well as second level signal interconnections 2A, 2B, 2C, 2D, 2E, 2F, 2G and 2H are illustrated as channels for layout of the first level and second level interconnections, part of which are for clock signal transmission. There are provided first level signal interconnections 12, 13 and 14 on which normal logic signals are transmitted as well as second level signal interconnections 23, 24, 25, 26 and 27 on which the normal logic signals are transmitted. Further, through holes 33 and 34 are formed to provide connections between the first level and second level interconnections. A first level clock signal interconnection 11 on which a clock signal is transmitted is furthermore provided as well as a second level clock signal interconnections 21 and 22 on which clock signals are transmitted are moreover provided. The first level and second level clock signal interconnections 11 and 21 are connected to each other through a though hole 31. The first level and second level clock signal interconnections 11 and 22 are connected to each other through a though hole 32. The clock signal is transmitted from the second level clock signal interconnection 21 to the second level clock signal interconnection 22.

As illustrated in FIG. 2, a distance $I_1$ between the first level clock signal interconnection 11 and the first level signal interconnection 13 is equal to a distance $I_2$ between the first level clock signal interconnection 11 and the first level signal interconnection 14. The distance $I_1$ and $I_2$ are two times of a normal distance $I_3$ between the first level clock signal interconnection 12 and the first level signal interconnection 13. A distance $L_1$ between the second level clock signal interconnection 21 and the second level signal interconnection 23 is equal to a distance $L_2$ between the second level clock signal interconnection 21 and the second level signal interconnection 24. A distance $L_3$ between the second level clock signal interconnection 22 and the second level signal interconnection 26 is equal to the distance $L_1$ and $L_2$. A distance $L_4$ between the second level clock signal interconnection 22 and the second level signal interconnection 27 is equal to the distance $L_1$, $L_2$ and $L_3$. The distances $L_1$, $L_2$ and $L_3$ and $L_4$ are each two times a distance $L_5$ between the second level interconnection 25 and the second level signal interconnection 26.

In the prior art, the routing processes of the clock signal interconnections 11, 21 and 22 are carried out separately from the routing processes of the logic signal interconnections 12, 13, 14, 23, 24, 25, 26 and 27 so that the width of the signal interconnections and the distance between the same are defined by the minimum width of the interconnections and the minimum distance between them which are restricted by the micro-lithography technique, whilst the distance between the clock signal interconnections is set at a predetermined distance.

The above conventional layout method, however has the following disadvantages or problems. Whereas it is possible to reduce the parasitic capacitance between the clock signal interconnections, it is difficult to reduce the parasitic capacitance between the normal signal interconnections. For those reasons, as micro-lithography techniques advance resulting in a reduction in distance between the adjacent pairs of signal interconnections, the parasitic capacitance between those signal interconnections increases. The increase in the parasitic capacitance between the adjacent pair of signal interconnections results in an increase in time-delay of signal transmissions on those signal interconnections. This degrades the frequency performance of the integrated circuit device.

Further, the time-delay of signal transmissions on the signal interconnections is not precisely predictable until after the actual routing has been carried out, for which reason as a ratio of the time-delay of the signal transmission to the signal transmission time is increased, it becomes difficult to predict performances of the device in the logic deign level prior to the layout. In order to settle this problem, it is required to carry out a layout design with excessively large margins.

On the other hand, the parasitic capacitance between the first level and second level signal interconnections may be reduced by increasing the thickness of the inter-layer insulator between the first level and second level interconnection layers. Notwithstanding, such technique is inapplicable to reduce the adjacent two signal interconnections in the same level, for which reason it is difficult to reduce the parasitic capacitance between the adjacent two signal interconnections.

SUMMARY OF THE INVENTION

Accordingly, it is an object of the present invention to provide a method of layout for semiconductor integrated circuits, which is free from any problems and disadvantages as described above.

It is a further object of the present invention to provide a method of layout for semiconductor integrated circuits, which is capable of reducing not only a parasitic capacitance between clock signal interconnections but also a parasitic capacitance between adjacent pairs of signal interconnections other than the clock signal interconnections.

It is a still further object of the present invention to provide a method of layout for semiconductor integrated circuits, which is capable of preventing time-delay of signal transmissions on the signal interconnections.

It is yet a further object of the present invention to provide a method of layout for semiconductor integrated circuits, which allows an improvement in high frequency performance of the semiconductor integrated circuits.

It is a further more object of the present invention to provide a method of layout for semiconductor integrated circuits, which allows prediction of device performances in the logic design level prior to the layout.

It is moreover object of the present invention to provide a method of layout for semiconductor integrated circuits, which is capable of suppression of a time-delay of signal transmission.

It is still more object of the present invention to provide a method of layout for semiconductor integrated circuits, which allows the layout design without, however, considering any excessively large margin.

It is yet more object of the present invention to provide a method of layout for semiconductor integrated circuits, which allows an improvement in performance of the semiconductor integrated circuits.

The present invention provides a method of laying out a semiconductor integrated circuit, comprising the steps of placing function cells, routing interconnections between the function cells, extracting a distance "di" between adjacent two of all interconnections on which signals are transmitted except for interconnections on which clock signals are transmitted, extracting a length "ai" of the interconnections which are arranged in parallel to each other at the corresponding distance "di", calculating $Cp=\Sigma_i(ai/di)$, and re-routing of the interconnections to reduce the value Cp.

It is preferable that the third step of extracting the distance "di", the fourth step of extracting the length "ai", the fifth step of calculation of Cp and sixth step of re-routing are repeated predetermined times. In this case, it is further preferable to further include the step of verifying a correspondence of the currently designed logic circuit to the desired logic circuit previously set and if the correspondence can be verified, then the layout processes are completed and if, however, no correspondence can be verified, then the process will be back to the first step of placement of the function cells.

It is also preferable that the third step of extracting the distance "di", the fourth step of extracting the length "ai", the fifth step of calculation of Cp and sixth step of re-routing are repeated until a difference between a reciprocal of a current Cp having currently been calculated and a previous reciprocal of a previous Cp having previously been calculated becomes smaller than a predetermined value. In this case, it is further preferable to further include the step of verifying a correspondence of the currently designed logic circuit to the desired logic circuit previously set and if the correspondence can be verified, then the layout processes are completed and if, however, no correspondence can be verified, then the process will be back to the first step of placement of the function cells.

BRIEF DESCRIPTIONS OF THE DRAWINGS

Preferred embodiments according to the present invention will be described in detail with reference to the accompanying drawings.

PREFERRED EMBODIMENTS

A first embodiment according to the present invention will be described in detail with reference to FIGS. 3 and 4, wherein a novel method of a semiconductor integrated circuit is provided.

Figure 3:
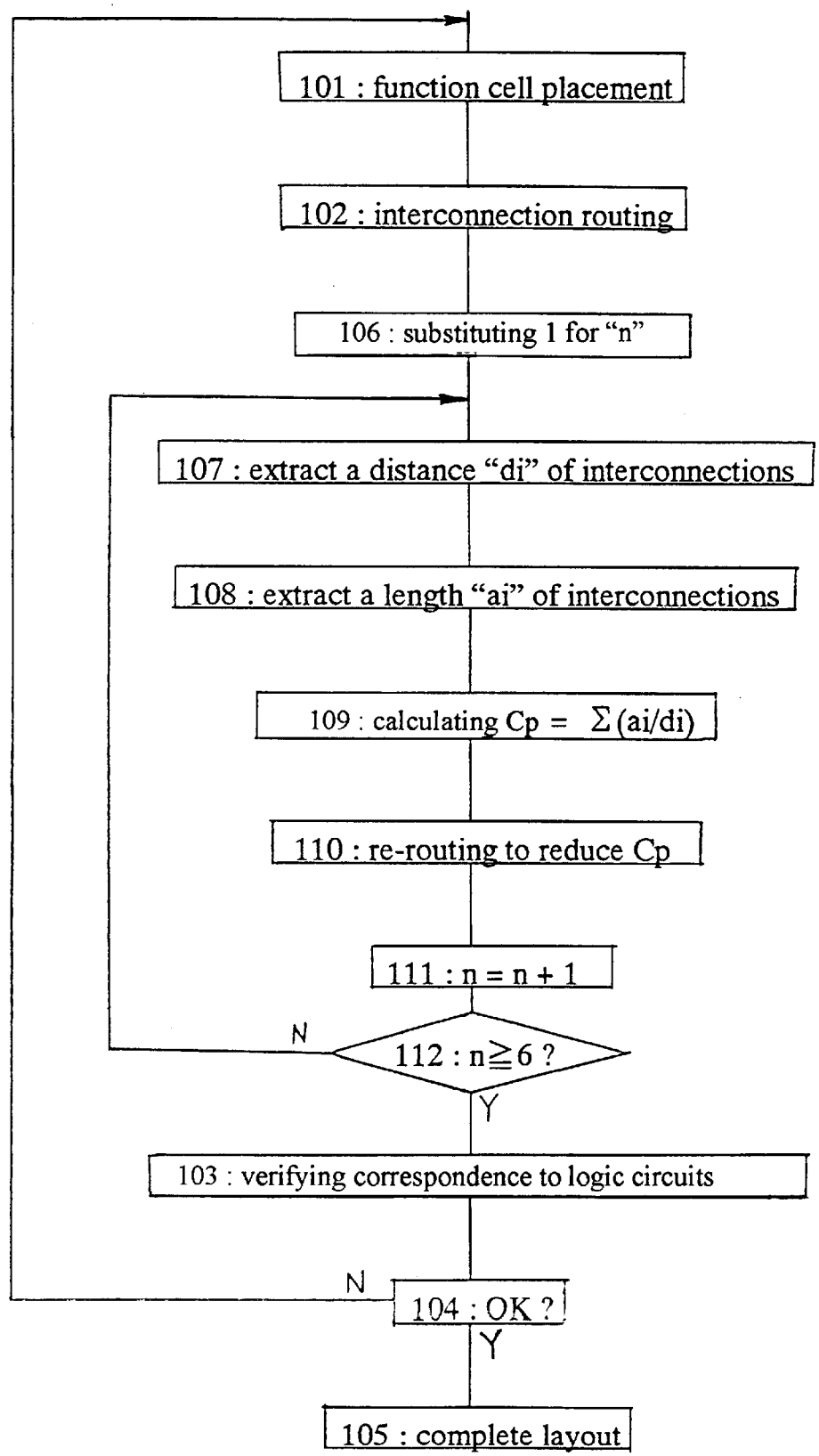
FIG. 3 is a flow chart illustrative of a novel layout method of a semiconductor integrated circuit in a first embodiment according to the present invention.

With reference to FIG. 3, the novel layout method for the semiconductor integrated circuits in accordance with the present invention will be described. First, a function cell placement 101 is carried out for subsequent interconnection routing 102. Then, an initialization process 106 is carried out by substituting "1" for a variable "n" which represents the number of repeating the following re-routing processes. A distance extraction process 107 is carried out by extracting a distance "di" between adjacent pairs of signal interconnections, on which signals are transmitted, except for clock signal interconnections on which clock signals are transmitted. A length extraction process 108 is carried out by extracting a length "ai" of the signal interconnections which are arranged in parallel to each other at the distance "di". A parasitic capacitance calculation process 109 is carried out by calculating a parasitic capacitance Cp of the interconnections for the whole length of the signal interconnections on the basis of the following equation.

$$Cp=\Sigma_i(ai/di)$$

Subsequently, a re-routing process 110 is carried out by re-routing the interconnections so as to reduce the parasitic capacitance Cp. Needless to say, it is most preferable to carry out one time the re-routing process 110 to minimize the total parasitic capacitance for the integrated circuit device. Since the distance between adjacent two interconnections is associative with the different adjacent two interconnections, for which reason it is, actually, however, difficult to obtain the minimum parasitic capacitance by carrying out one-time the re-routing process. In order to obtain the minimum parasitic capacitance, it is preferable to carry out re-routing processes as many as possible. In the first embodiment, the re-routing process is repeated five times. The above re-routing process 110 is repeated whereby increment by one of the number "n" is made in a counting process 111. In a process 112, if the number "n" is still less than 6, then the next step is back to the distance extraction process 107 for the length extraction process 108 and the subsequent parasitic capacitance calculation process 109. The re-routing process 110 is again carried out the number "n" becomes 6 in a process 112. Thereafter, the increment by one of the number "n" is made in the counting process 111. The above looped processes 107 through 112 including the re-routing process 110 are repeated until the number "n" reaches 6. If the number "n" reaches 6, the above looped processes 107 through 112 including the re-routing process 110 are discontinued for subsequent verify process 103 for verifying the correspondence of the currently designed logic circuit to the desired logic circuit. If the correspondence can be verified, then the layout processes are completed in a complete process 105. If, however, no correspondence can be verified, then the process will be back to the first step of the function cell placement process 101.

Figure 4:
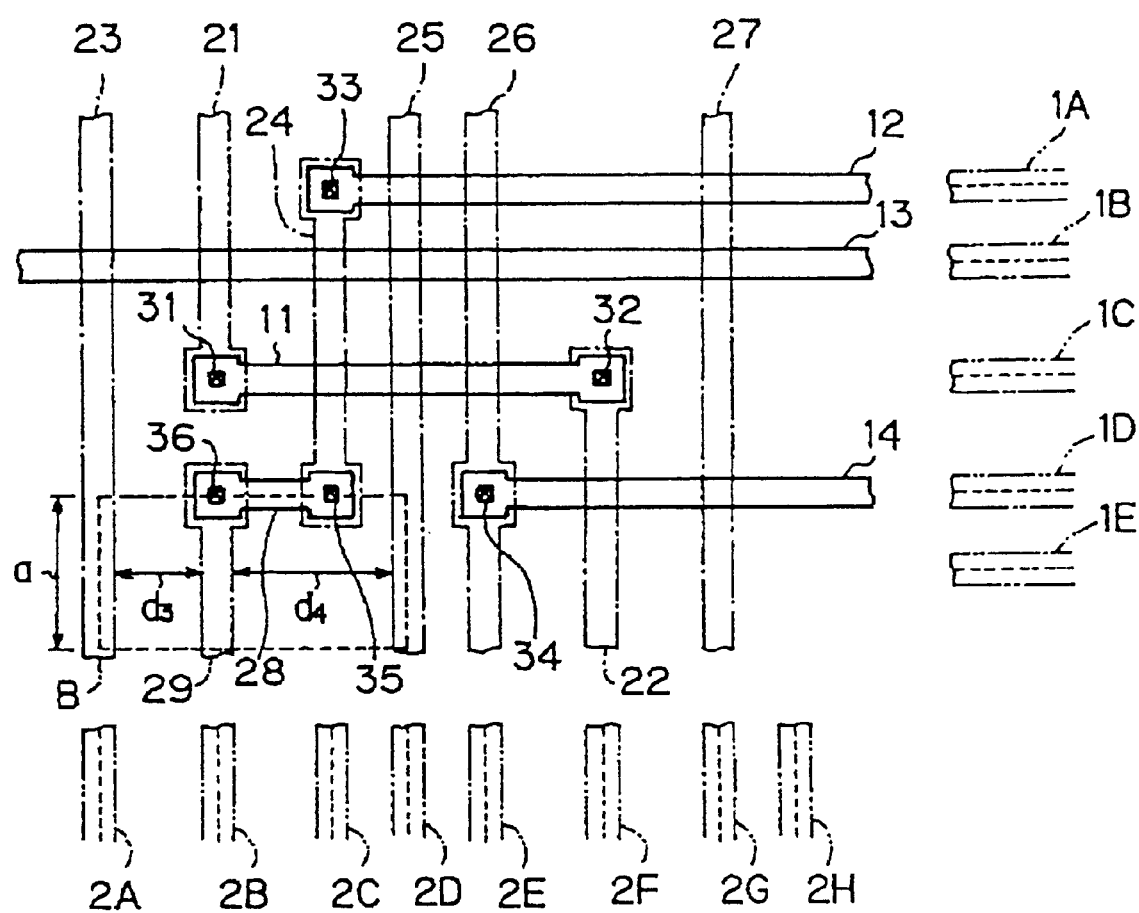
FIG. 4 is a plan view illustrative of a novel automatic routing of interconnections between function cells in the semiconductor integrated circuits in accordance with the present invention.

As illustrated in FIG. 4, first level signal interconnections 1A, 1B, 1C, 1D, and 1E as well as second level signal interconnections 2A, 2B, 2C, 2D, 2E, 2F, 2G and 2H are illustrated as channels for layout of the first level and second level interconnections, part of which are for clock signal transmission. There are provided first level signal interconnections 12, 13, 14 and 28 on which normal logic signals are transmitted as well as second level signal interconnections 23, 24, 25, 26, 27 and 29 on which the normal logic signals are transmitted. Further, through holes 33, 34 35 and 36 are formed to provide connections between the first level and second level interconnections. A first level clock signal interconnection 11 on which a clock signal is transmitted is furthermore provided as well as second level clock signal interconnections 21 and 22 on which clock signals are transmitted are moreover provided. The first level and second level clock signal interconnections 11 and 21 are connected to each other through a though hole 31. The first level and second level clock signal interconnections 11 and 22 are connected to each other through a though hole 32. The clock signal is transmitted from the second level clock signal interconnection 21 to the second level clock signal interconnection 22.

Figure 1:
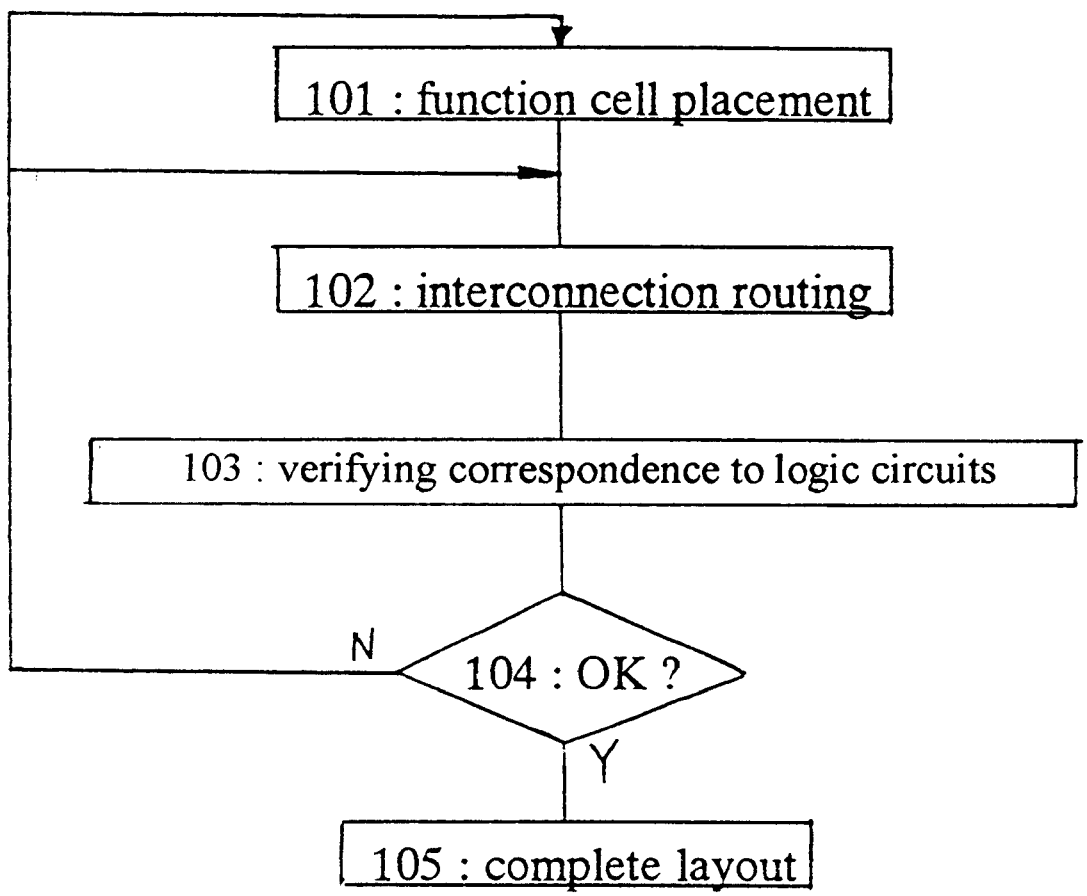
FIG. 1 is a flow chart illustrative of the conventional layout method comprising the automatic placement and subsequent automatic routing.
Figure 2:
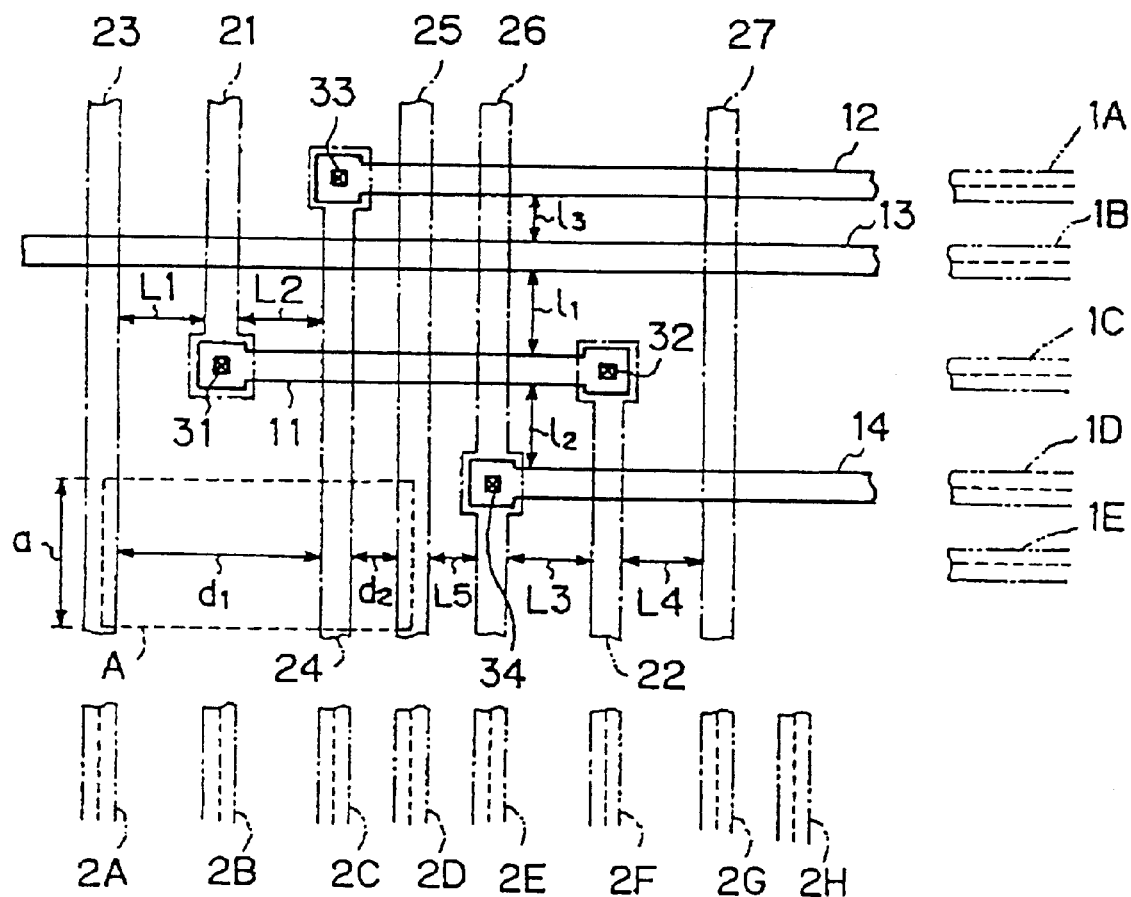
FIG. 2 is a plan view illustrative of the conventional automatic routing of interconnections between function cells in the semiconductor integrated circuits.

In the conventional layout method illustrated in FIG. 2, attention is drawn onto a region surrounded by a broken line "A" wherein a length of the interconnection represents "a". The second level signal interconnection 23 is separated by a distance d1 from the second level signal interconnection 24. The second level signal interconnection 25 is separated by a distance d2 from the second level signal interconnection 24.

By contrast, in the first embodiment illustrated in FIG. 4, the attention is drawn onto a region surrounded by a broken line "B" wherein a length of the interconnection represents "a". The second level signal interconnection 23 is separated by a distance d3 from the second level signal interconnection 29. The second level signal interconnection 25 is separated by a distance d4 from the second level signal interconnection 29.

If, for example, the distance between the second level signal interconnections are made equal to the distance d2, then in the conventional layout method d1=5d2. Thus, a parasitic capacitance Cp is given as follows.

$$Cpa = a/d2 + a/5d2$$

$$= 6a/5d2$$

$$= 24a/20d2.$$

By contrast, in accordance with the present invention, d3=2d2, and d4=4d2. Thus, a parasitic capacitance Cp is given as follows.

$$Cpa = a/d2 + a/4d2$$

$$= 3a/4d2$$

$$= 15a/20d2.$$

The above facts demonstrate that the parasitic capacitance Cp of the interconnections is smaller in the present invention than that in the conventional layout method. As will be described below, in accordance with the present invention, the re-routing is carried out so that the channel for the signal interconnection is shifted from the channel 2C to the channel 2B in order to make the parasitic capacitance smaller. By contrast, in the conventional layout method, no re-routing is carried out so the channel for the signal interconnection remains unshifted to be channel 2C.

In accordance with the present invention, the shifting of the channel for the signal interconnection requires an additional first level signal interconnection 28 which may increase the parasitic capacitance of the interconnections. Notwithstanding, if the length "a" is sufficiently longer than the length of the additional first level signal interconnection 28, then it may be possible to ignore the increase in parasitic capacitance of the interconnections because the effect of the reduction in the parasitic capacitance due to shifting the channel is much greater than the above increase in parasitic capacitance of the interconnections by adding the short signal interconnection 28.

Needless to say, it is most preferable to carry out the layout so as to minimize the total parasitic capacitance for the integrated circuit device. Since the distance between adjacent two interconnections is associative with the different adjacent two interconnections, for which reason it is, actually, however, difficult to obtain the minimum parasitic capacitance by a single re-routing process. In order to certainly obtain the minimum parasitic capacitance, it is preferable to carry out re-routing processes as many as possible. In the first embodiment, the re-routing process is repeated five times.

Since the thickness of the interconnections generally remains unchanged over entire regions and the parasitic capacitance corresponds to the interconnection capacitance of the second level interconnection 29, the interconnection capacitance of the second level interconnection 29 is reduced by about 37%.

As described above, in accordance with the present invention, it is possible to reduce not only a parasitic capacitance between clock signal interconnections but also a parasitic capacitance between adjacent two signal interconnections other than the clock signal interconnections.

This prevents time-delay of signal transmissions on the signal interconnections. This further allows an improvement in high frequency performance of the semiconductor integrated circuits. It is further possible to facilitate prediction of device performances in the logic design level prior to the layout. It is furthermore possible to suppress a time-delay of signal transmission. It is moreover possible to allow the layout design without, however, considering any excessively large margin. Those allow an improvement in performance of the semiconductor integrated circuits.

A second embodiment according to the present invention will be described in detail with reference to FIGS. 5 and 4, wherein a novel method of a semiconductor integrated circuit is provided.

Figure 5:
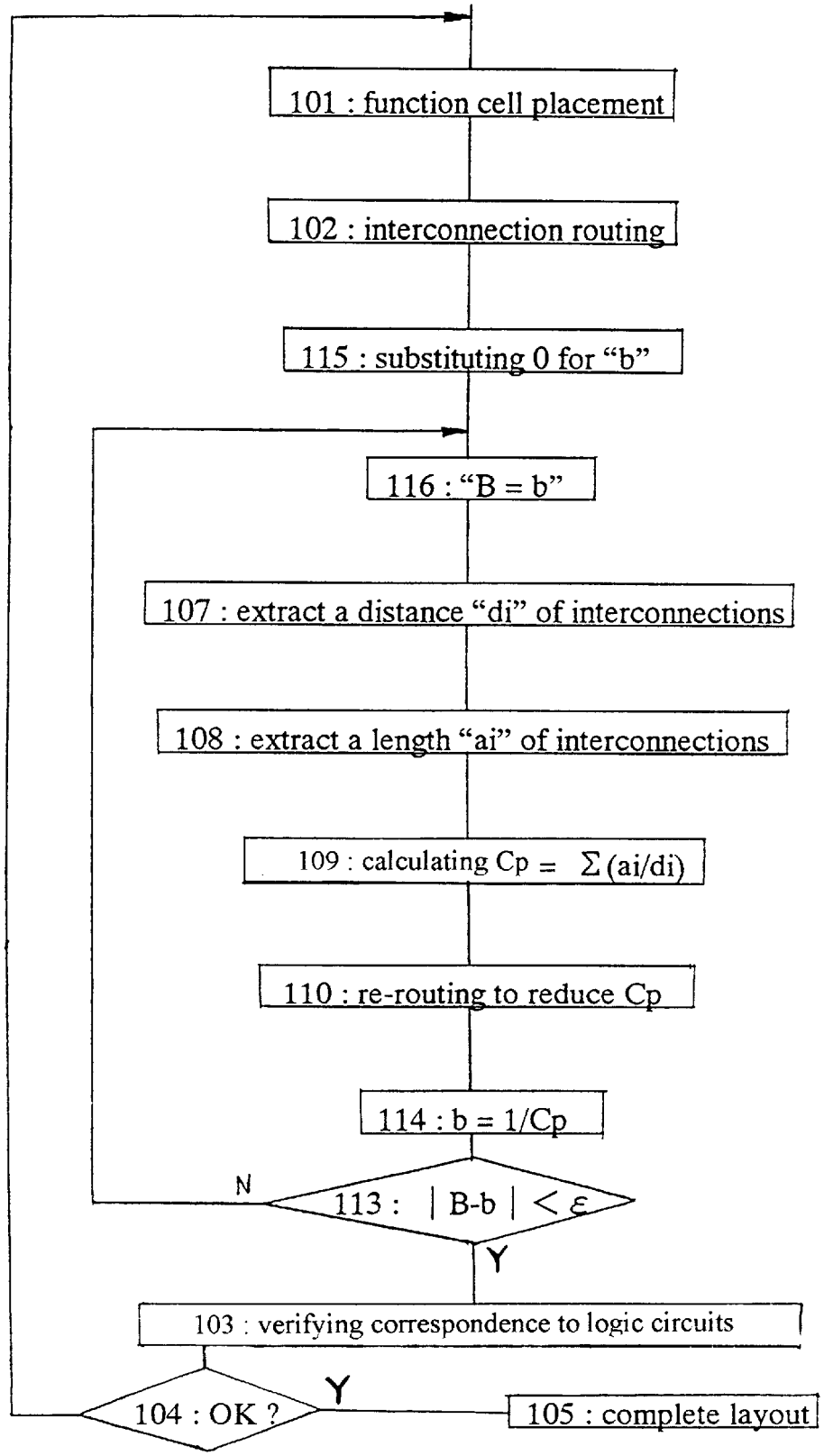
FIG. 5 is a flow chart illustrative of a novel layout method of a semiconductor integrated circuit in a second embodiment according to the present invention.

With reference to FIG. 5, the novel layout method for the semiconductor integrated circuits in accordance with the present invention will be described. First, a function cell placement 101 is carried out for subsequent interconnection routing 102. Then, an initialization process 105 is carried out by substituting "0" for a variable "b". In a renewal process 116, a variable "B" is set to be "b". A distance extraction process 107 is carried out by extracting a distance "di" between adjacent two of all signal interconnections, on which signals are transmitted, except for clock signal interconnections on which clock signals are transmitted. A length extraction process 108 is carried out by extracting a length "ai" of the signal interconnections which are arranged in parallel to each other at the distance "di". A parasitic capacitance calculation process 109 is carried out by calculating a parasitic capacitance Cp of the interconnections for whole length of the signal interconnections on the basis of the following equation.

$$Cp = \Sigma_i(ai/di)$$

Subsequently, a re-routing process 110 is carried out by re-routing the interconnections so as to reduce the parasitic capacitance Cp. In a process 114, subsequently, a reciprocal number of the current parasitic capacitance Cp is found to be substituted for "b", wherein "B" represents a reciprocal number of the former parasitic capacitance Cp. In the process 113, an absolute value of a difference between "B" representing a reciprocal number of the former parasitic capacitance Cp and "b" representing a reciprocal number of the current parasitic capacitance Cp for verifying whether the difference |B−b| is smaller than a predetermined reference value or whether or not |B−b|<ε is satisfied in the process 113. If |B−b|<ε is not satisfied, then the next step is back to the renewal process 116, wherein the variable "B" is set to be "b". Subsequently, the processes 107, 108, 109, 110 and 114 and 113 are repeated until |B−b|<ε is satisfied. If |B−b|<ε is satisfied, then the above looped processes 116, 107, 108, 109, 110 114 and 113 including the re-routing process 110 are discontinued for subsequent verify process 103 for verifying the correspondence of the currently designed logic circuit to the desired logic circuit. If the correspondence can be verified, then the layout processes are completed in a complete process 105. If, however, no correspondence can be verified, then the process will be back to the first step of the function cell placement process 101. As discussed above in relation to FIG. 4, this embodiment improves performance of the semiconductor integrated circuits.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of laying out a semiconductor integrated circuit having plural levels, comprising the steps of:

placing function cells;

routing interconnections between said function cells;

carrying out an initialization process by substituting "1" for a variable "n" which represents a number of repetitions of the following re-routing process,
   (1) extracting a distance "di" between adjacent pairs of the interconnections at the same level of the integrated circuit on which signals are transmitted,
   (2) extracting a length "ai" of the interconnections which are arranged in parallel to each other at the corresponding distance "di",
   (3) calculating $Cp = \Sigma_i(ai/di)$,
   (4) re-routing the interconnections to reduce the value Cp,
   (5) incrementing the variable "n" by one, and
   (6) evaluating whether the variable "n" is not less than a first number of repetitions and returning to the step (1) only if the variable "n" is less than the first number; and verifying a correspondence of the laid out circuit to a desired circuit and if the correspondence can be verified, then the laying out method is completed and if the correspondence cannot be verified, then returning to the step of placing function cells and repeating the entire laying out method.

2. A method of laying out a semiconductor integrated circuit having plural levels, comprising the steps of:

placing function cells;

routing interconnections between said function cells;

carrying out an initialization process by substituting "0" for a variable "b";

carrying out the following process,
   (1) setting a variable "B" to the value of the variable "b",
   (2) extracting a distance "di" between adjacent pairs of the interconnections at the same level of the integrated circuit on which signals are transmitted,
   (3) extracting a length "ai" of the interconnections which are arranged in parallel to each other at the corresponding distance "di",
   (4) calculating $Cp = \Sigma_i(ai/di)$,
   (5) setting "b" to 1/Cp, and
   (6) evaluating whether an absolute value of a difference between the variable "B" and the variable "b" is smaller than a reference value, and then returning to the step of setting the variable "B" to be the variable "b" only if the absolute value is not smaller than the reference value; and verifying a correspondence of the laid out circuit to a desired circuit and if the correspondence can be verified, then the laying out method is completed and if the correspondence cannot be verified, then returning to the step of placing function cells and repeating the entire laying out method.

* * * * *